United States Patent
Kim et al.

(10) Patent No.: US 7,902,073 B2
(45) Date of Patent: Mar. 8, 2011

(54) GLUE LAYER FOR HYDROFLUOROCARBON ETCH

(75) Inventors: Ji Soo Kim, Pleasanton, CA (US);
Sangheon Lee, Dublin, CA (US);
Deepak K. Gupta, Fremont, CA (US);
S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 714 days.

(21) Appl. No.: 11/610,953

(22) Filed: Dec. 14, 2006

(65) Prior Publication Data
US 2008/0146032 A1    Jun. 19, 2008

(51) Int. Cl.
*H01L 21/311* (2006.01)
(52) U.S. Cl. ......... 438/694; 438/654; 438/689; 438/781; 438/784
(58) Field of Classification Search .......... 438/689, 438/694, 654, 781, 784
See application file for complete search history.

(56) References Cited

U.S. PATENT DOCUMENTS

| | | | | |
|---|---|---|---|---|
| 5,501,893 A | * | 3/1996 | Laermer et al. | 428/161 |
| 6,197,704 B1 | * | 3/2001 | Endo et al. | 438/781 |
| 6,472,107 B1 | * | 10/2002 | Chan | 430/5 |
| 6,630,410 B2 | * | 10/2003 | Trapp et al. | 438/723 |
| 2002/0022281 A1 | * | 2/2002 | Flanner et al. | 438/8 |
| 2005/0181598 A1 | * | 8/2005 | Kailasam | 438/654 |
| 2006/0130873 A1 | | 6/2006 | Richardson et al. | 134/1.1 |
| 2006/0157448 A1 | * | 7/2006 | Magni et al. | 216/67 |

* cited by examiner

*Primary Examiner* — Nadine G Norton
*Assistant Examiner* — Mahmoud Dahimene
(74) *Attorney, Agent, or Firm* — Beyer Law Group LLP

(57) ABSTRACT

A method for etching features in an etch layer disposed below a mask on a process wafer is provided. A hydrocarbon based glue layer is deposited. The etch layer on the process wafer is etched with at least one cycle, wherein each cycle comprises depositing a hydrofluorocarbon layer over the mask and on the hydrocarbon based glue layer, wherein the hydrocarbon based glue layer increases adhesion of the hydrofluorocarbon layer and etching the etch layer.

18 Claims, 9 Drawing Sheets

GLUE LAYER FOR HYDROFLUOROCARBON ETCH

BACKGROUND OF THE INVENTION

1. Field of the Invention

The invention relates to semiconductor devices. More specifically, the invention relates to etching features to form semiconductor devices.

2. Description of the Related Art

In the formation of semiconductor devices, a dielectric layer may be etched using a process that deposits a hydrofluorocarbon layer. Such a hydrofluorocarbon layer may be used to protect the mask, control sidewall shape, or control feature size.

SUMMARY OF THE INVENTION

To achieve the foregoing and in accordance with the purpose of the present invention, a method for etching features in an etch layer disposed below a mask on a process wafer is provided. A hydrocarbon based glue layer is deposited. The etch layer on the process wafer is etched with at least one cycle, wherein each cycle comprises depositing a hydrofluorocarbon layer over the mask and on the hydrocarbon based glue layer, wherein the hydrocarbon based glue layer increases adhesion of the hydrofluorocarbon layer and etching the etch layer.

In another manifestation of the invention an apparatus for etching features in an etch layer below a mask is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a glue layer gas source, a hydrofluorocarbon deposition phase gas source, and an etch phase gas source. A controller is controllably connected to the gas source and the at least one electrode and comprises at least one processor and computer readable media. The computer readable media comprises computer readable code for depositing a hydrocarbon based glue layer and computer readable code for etching features into the etch layer, comprising computer readable code for depositing a hydrofluorocarbon deposition and computer readable code for etching the etch layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
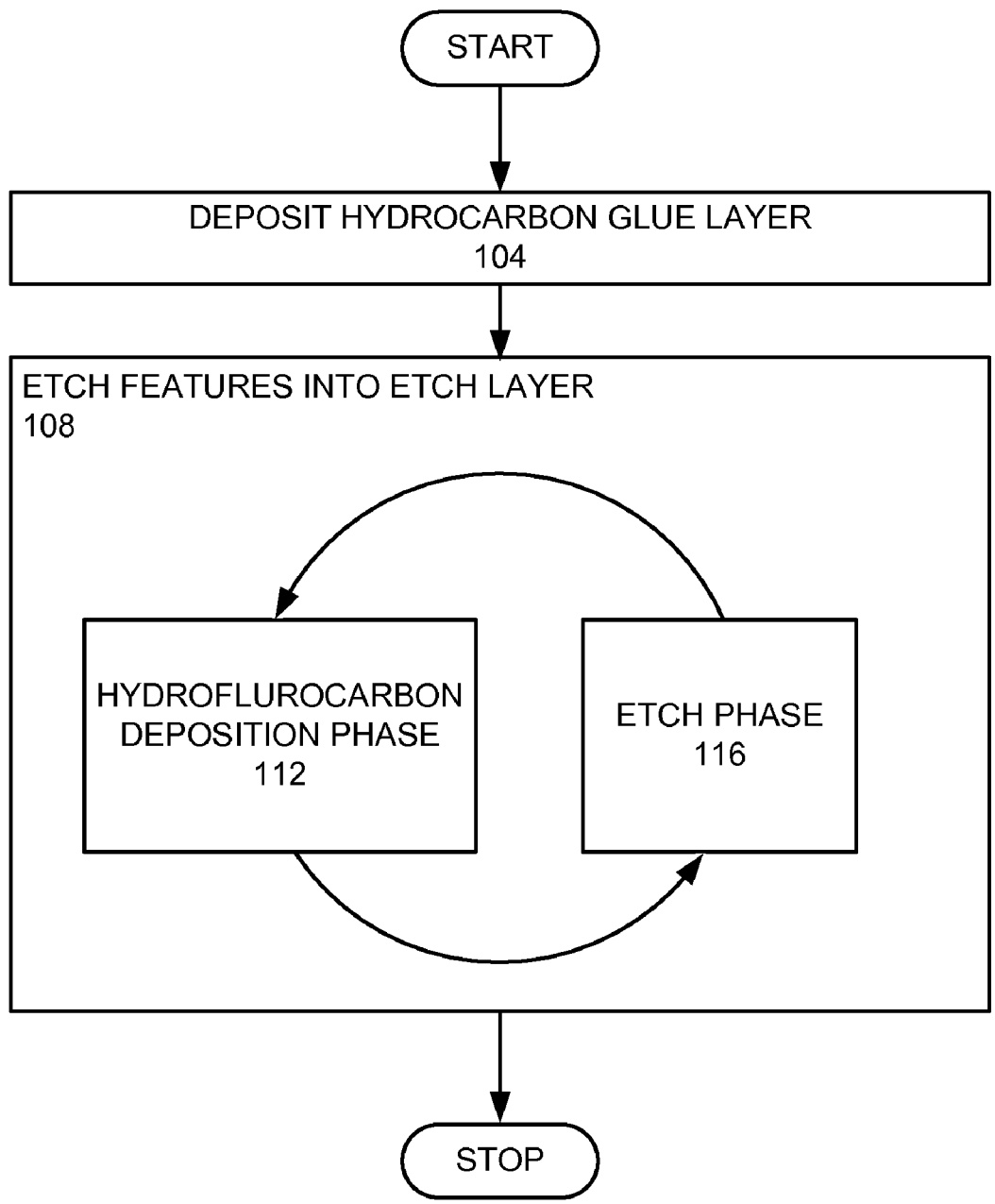
FIG. 1 is a high level flow chart for part of a process for forming a feature in an etch layer that uses the invention.

To facilitate understanding, FIG. 1 is a high level flow chart for part of a process for etching features in an etch layer that uses the invention. A hydrocarbon based glue layer is deposited (step 104). The hydrocarbon based glue layer is preferably a fluorine free layer with a chemical formula of $C_xH_y$, which preferably may be a fluorine free polymer or amorphous carbon. Features are then etched into an etch layer using at least one cycle where each cycle comprises a phase of depositing a hydrofluorocarbon ($C_xH_yF_z$) layer on the glue layer (step 112) and a phase of etching the features into the etch layer. The glue layer increases the adhesion of the hydrofluorocarbon layer.

Figure 2A:
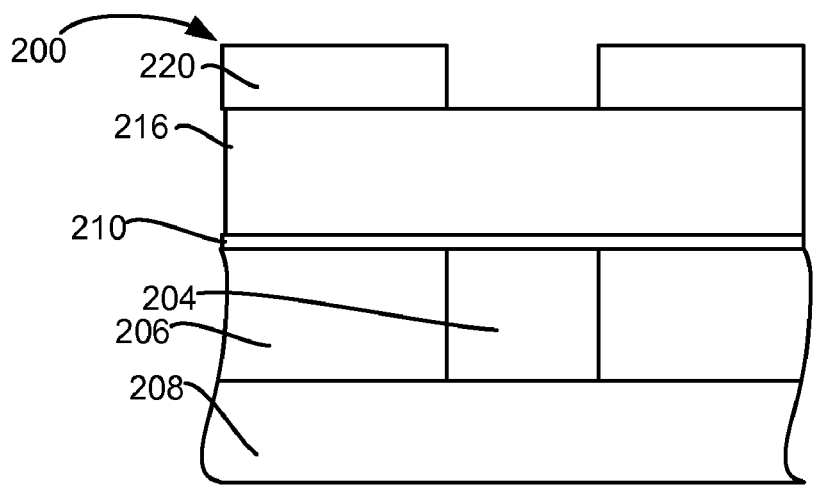
FIGS. 2A-J are schematic cross-sectional views of part of a wafer that may be used in the inventive process.

In a specific example of an embodiment of the invention, a process wafer is placed in an etch chamber. FIG. 2A is a schematic cross-sectional view of part of a wafer and stack 200 that may be used in the inventive process. The stack 200 in this example comprises at least one conductive contact 204 in a contact layer 206 over a substrate or wafer 208. A barrier layer 210 is placed over the conductive contact 204. The conductive contact 204 in this example is copper. In this example the barrier layer is silicon nitride (SiN). An etch layer 216 is placed over the barrier layer 210. In this example, the etch layer is a silicon oxide based dielectric layer or a low-k (k<4.0) dielectric material. A photoresist mask 220 is placed over the dielectric etch layer 216. Although the discussed layers are shown to be on top of each other (i.e. the photoresist mask is directly on top of the dielectric etch layer), one or more layers may be placed between such layers, (i.e. an anti-reflective layer may be placed between the photoresist mask and the dielectric etch layer). This is why in the specification and claims various layers are described as being "over" other layers. Possible intermediate layers are not shown for the sake of clarity.

Figure 2B:
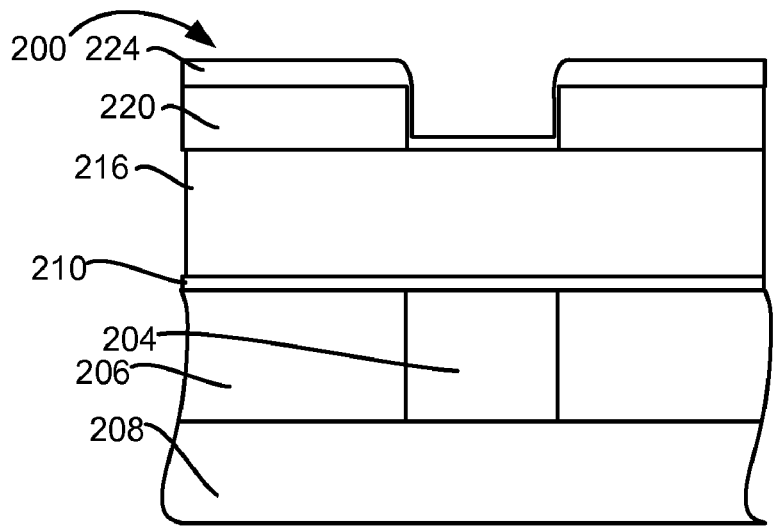

A hydrocarbon based glue layer 224 is deposited on the photoresist mask 220 and exposed surface of the etch layer 216 (step 104), as shown in FIG. 2B. The hydrocarbon based glue layer 224 tends to deposit more on horizontal surfaces, such as the top of the mask and the bottom of the mask features and less on the vertical surfaces such as the mask feature sidewalls, as shown. Preferably, the glue layer is a hydrocarbon polymer layer with a thickness of less than 1000 Å on the horizontal surfaces on top of the mask. More preferably, the glue layer has a thickness of less than 300 Å on the horizontal surfaces on top of the mask. Most preferably, the glue layer has a thickness no greater than 200 Å on the horizontal surfaces on top of the mask. For sidewall deposition, preferably the glue layer has a sidewall thickness of less than 10 Å. More preferably, the sidewall thickness of the glue layer is less than 5 Å. Therefore, a horizontal layer thickness may be about 200 Å and a sidewall thickness may be about 5 Å, providing a horizontal layer thickness to sidewall thickness ratio of 40:1.

An example of a recipe for providing a glue layer provides a pressure of 120 mTorr. Power is provided with 400 Watts at 27 MHz. A glue layer gas for forming a hydrocarbon glue layer is provided as 240 sccm $C_2H_4$, 175 sccm $N_2$, and 210 Ar. A TGF (TGF means tuning gas feed) is also provided. In this process, a fluorine free hydrocarbon gas is provided by providing component gases with carbon and component gases with hydrogen or preferably by providing hydrocarbon molecules in a gas state. Using hydrocarbon molecules in a gas state ensures desired flow ratios. A plasma is formed from the fluorine free hydrocarbon gas.

Figure 2C:
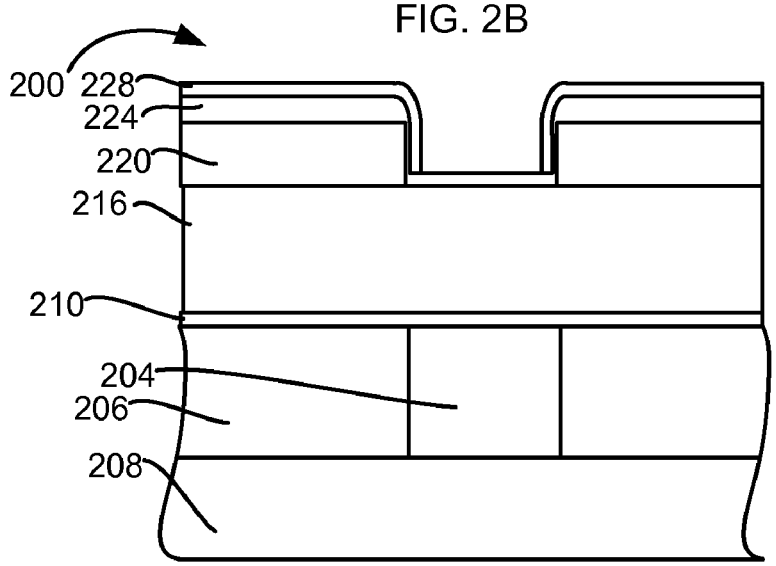
Figure 2D:
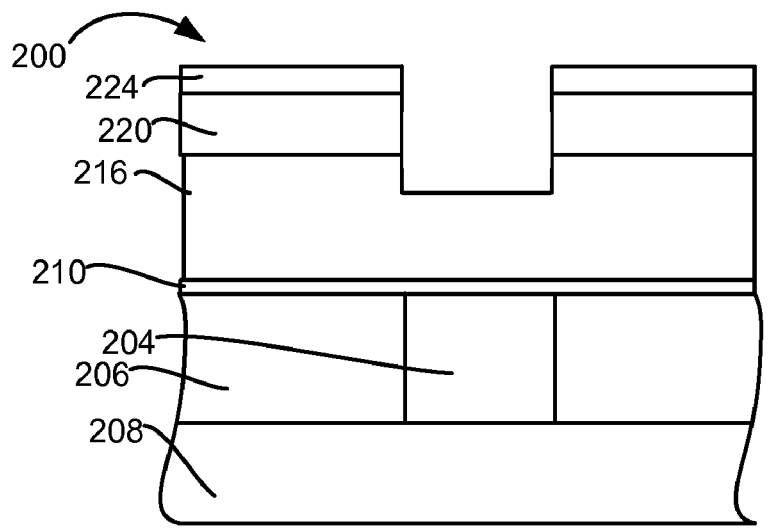

Features are then etched into the dielectric layer (step 108). In this example, the etch uses four cycles where each cycle comprises a hydrofluorocarbon deposition phase (step 112) and an etch phase (step 116). FIG. 2C is a cross sectional view after a first hydrofluorocarbon deposition phase (step 112), which provides a hydrofluorocarbon layer 228. The hydrofluorocarbon deposition is able to more easily form thicker deposits on vertical surfaces, such as sidewalls compared to hydrocarbon depositions, as shown. For example, the hydrofluorocarbon layer may have a horizontal surface thickness over the top of the mask of greater than 100 Å, for example about 200 Å, and a sidewall thickness of about 30 Å, so that the ratio of the horizontal surface thickness to the sidewall thickness is about 20:3. In a preferred embodiment, little or no hydrofluorocarbon is deposited on the bottom of the feature, although in other embodiments hydrofluorocarbon is deposited on the bottom of the feature. FIG. 2D is a cross sectional view after an etch phase (step 116). In this example, the hydrofluorocarbon and sidewall depositions have been etched away, although in other embodiments some of the sidewall may remain. The hydrocarbon layer on the bottom of the feature is etched away allowing part of the etch layer 216 to be etched.

An example of a recipe for the hydrofluorocarbon deposition phase provides a pressure of 140 mTorr. Power is provided at 800 Watts at 27 MHz. A hydrofluorocarbon deposition gas of 350 sccm $CH_3F$, 175 sccm $N_2$, and 210 sccm Ar with a tuning gas feed is provided. In this process, a hydrofluorocarbon gas is provided by providing component gases, which provide hydrogen, carbon, and fluorine, or preferably by providing hydrofluorocarbon molecules in a gas state. Using hydrofluorocarbon molecules in a gas state provides desired flow ratios. A plasma is formed from the hydrofluorocarbon gas.

An example of a recipe for an etch phase provides a pressure of 40 mTorr. Power is provided at 1600 Watts at 27 MHz. An etch gas of 130 sccm $CF_4$ is provided.

Figure 2E:
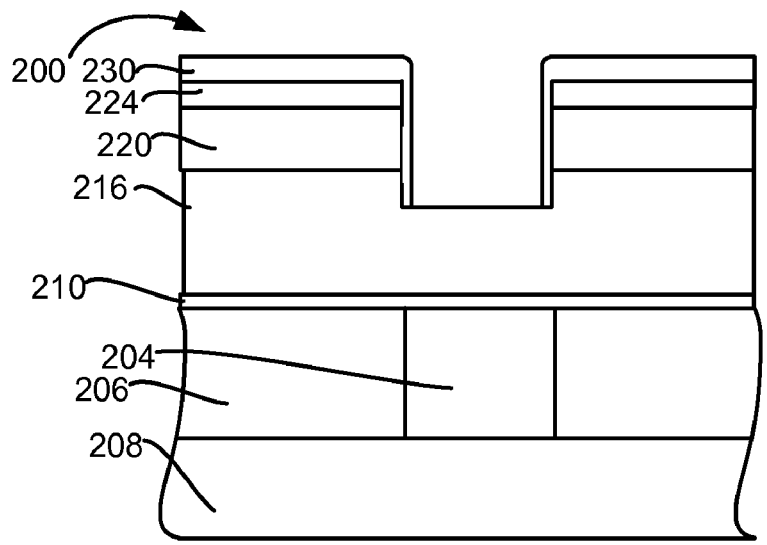
Figure 2F:
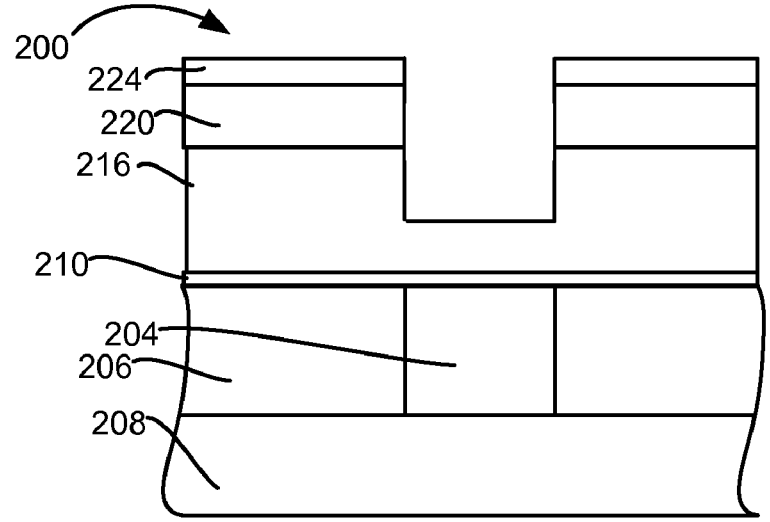

FIG. 2E is a cross sectional view after a hydrofluorocarbon deposition phase (step 112) during a second cycle, where a second hydrofluorocarbon layer 230 is deposited. FIG. 2F is a cross sectional view after an etch phase (step 116) for the second cycle. Again, in this example the hydrofluorocarbon deposition has been etched away.

Figure 2G:
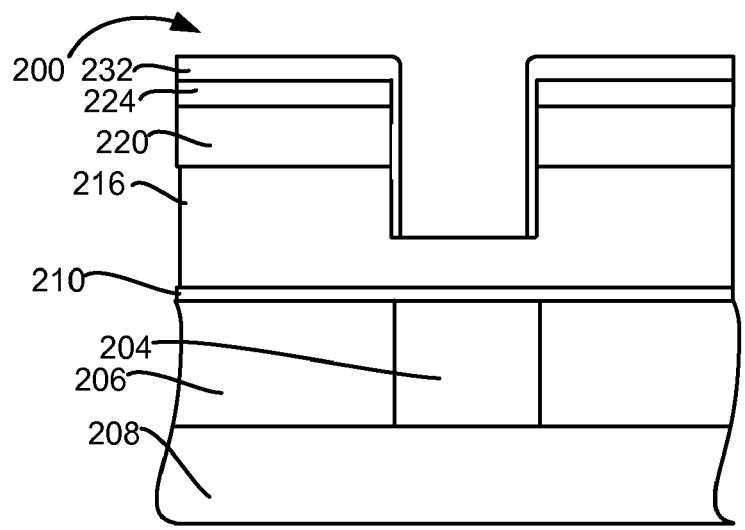
Figure 2H:
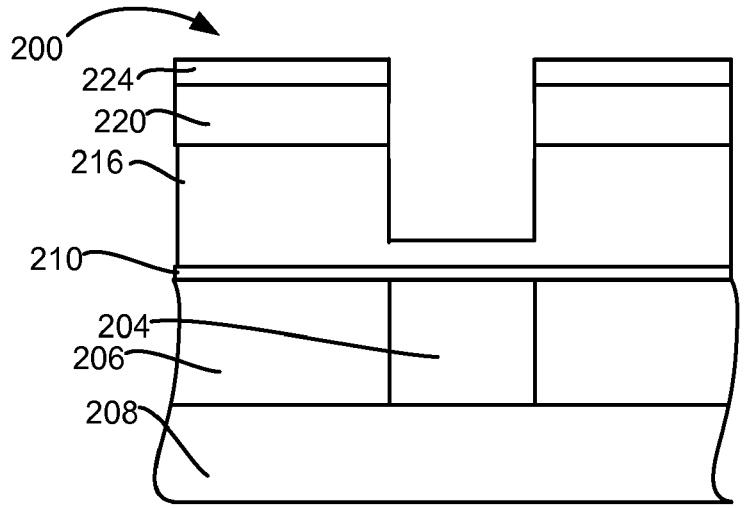

FIG. 2G is a cross sectional view after a hydrofluorocarbon deposition phase (step 112) during a third cycle, where a third hydrofluorocarbon layer 232 is deposited. FIG. 2H is a cross sectional view after an etch phase (step 116) for the third cycle. Again, in this example the hydrofluorocarbon deposition has been etched away.

Figure 2I:
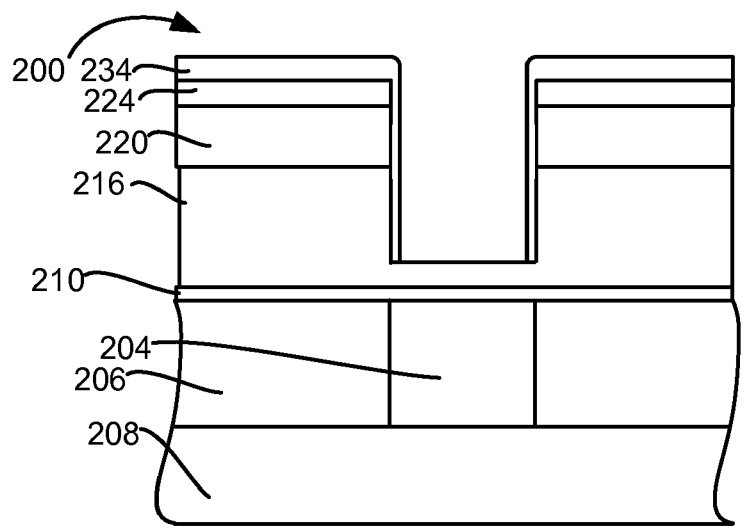
Figure 2J:
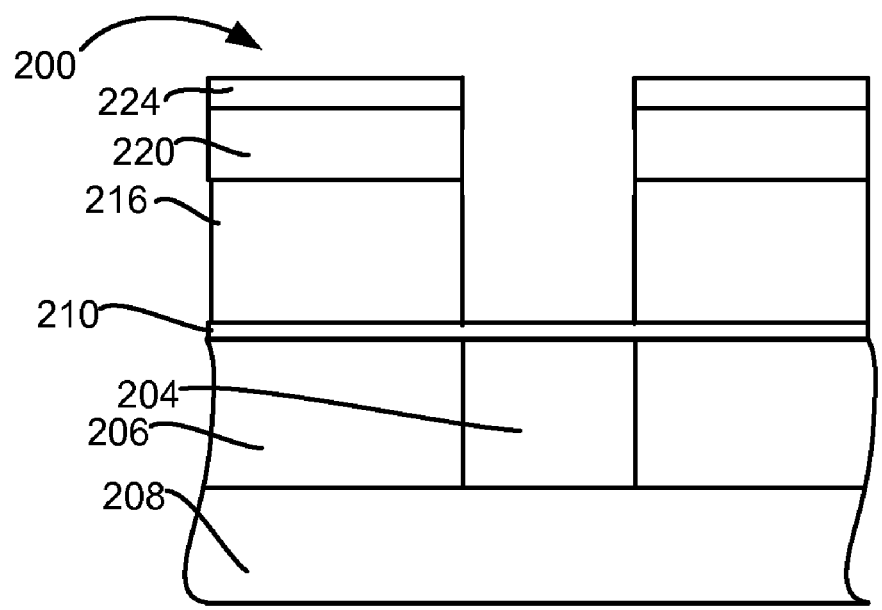

FIG. 2I is a cross sectional view after a hydrofluorocarbon deposition phase (step 112) during a fourth cycle, where a fourth hydrofluorocarbon layer 234 is deposited. FIG. 2J is a cross sectional view after an etch phase (step 116) for the third cycle. Again, in this example the hydrofluorocarbon deposition has been etched away. A feature has been etched completely through the etch layer 216.

The use of a cyclical process that alternates between depositing hydrofluorocarbon sidewalls and etching to etch features into an etch layer allows for improved control of the etch. The addition of hydrofluorocarbon sidewalls in this example allowed for the formation of vertical sidewalls, wherein vertical sidewalls make an angle of between 88° to 92° with the bottom of the feature from the top to the bottom of the wall of the feature. In this example, the formation of the hydrofluorocarbon sidewalls was used to prevent increasing of the CD of the etched features. In other embodiments, the hydrofluorocarbon sidewalls may be used to reduce the increase of the CD of the features or to shrink the features. Additional advantages may be provided by depositing hydrofluorocarbon sidewalls.

The use of hydrofluorocarbon sidewalls is more advantageous over the use of hydrocarbon sidewalls, since hydrofluorocarbon depositions cause less stress than hydrocarbon depositions, and thus result in less wiggling and because hydrofluorocarbon depositions may be used to provide thicker depositions on the sidewalls and thinner depositions on horizontal surfaces, such as the bottom of the features than hydrocarbon depositions. By using hydrofluorocarbon depositions to provide less deposition on the feature bottoms, less etching is required to etch through a layer deposited on the feature bottoms.

It has been found that hydrofluorocarbon depositions have adhesion problems. For example, a hydrofluorocarbon deposition on a photoresist mask or sidewalls of an etch layer may be subjected to blistering, which may be caused by the presence of moisture and thermal stress. Hydrofluorocarbon deposition on etch chamber surfaces such as the upper electrode may flake and cause particle contaminants.

It has been unexpectedly found that providing a hydrocarbon glue layer before the hydrofluorocarbon deposition improves hydrofluorocarbon adhesion, thus reducing or eliminating adhesion problems.

In this embodiment each time a process wafer is placed in an etch chamber a glue layer is deposited. The glue layer may be used to form a glue layer on chamber surfaces in addition to the wafer.

In another embodiment, the glue layer is not deposited on a process wafer, but only on chamber surfaces or chamber surfaces and a blank wafer after a wafer cleaning process.

Figure 5:
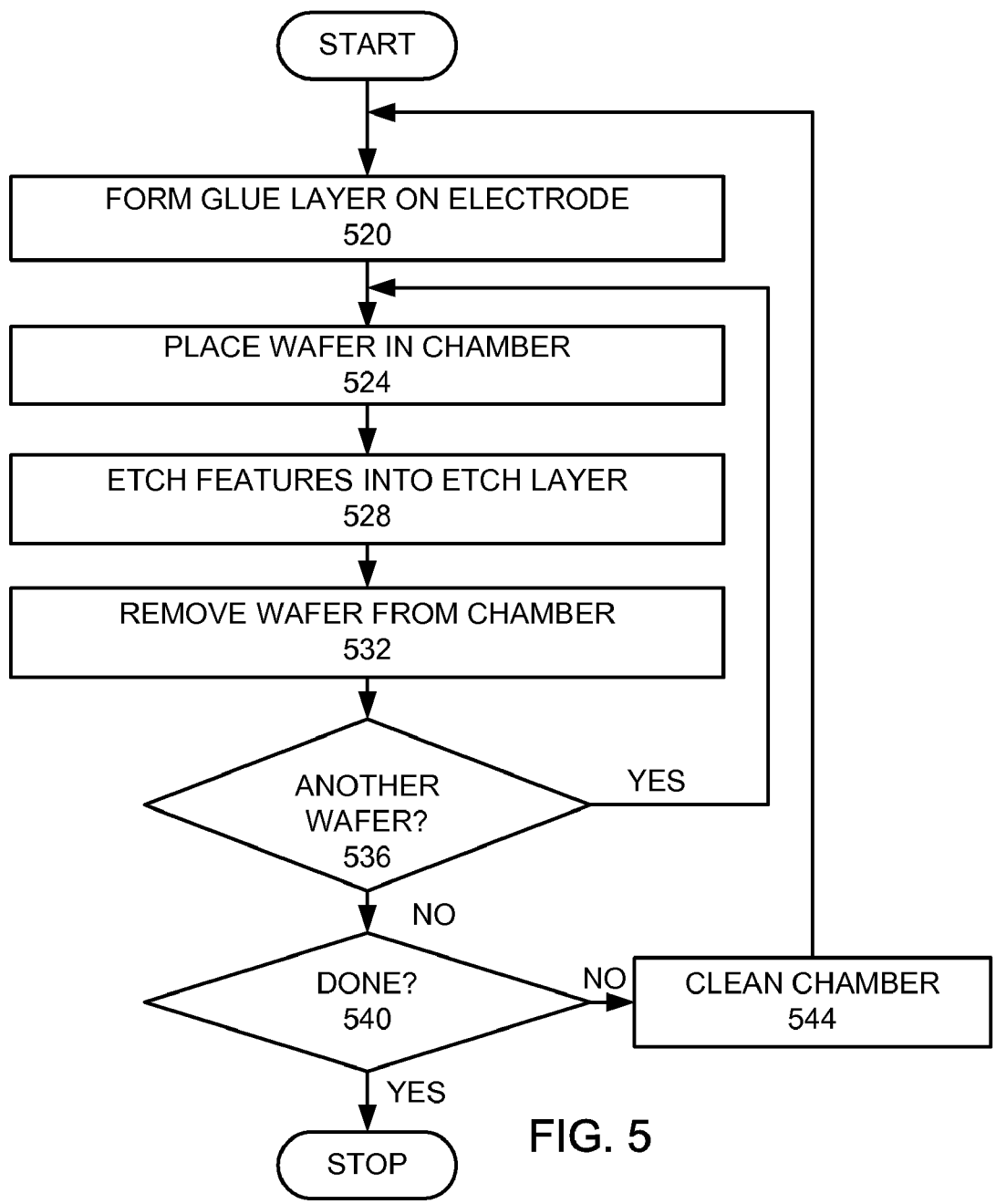
FIG. 5 is a more detailed flow chart of an embodiment of the invention used with waferless automatic clean process.

To facilitate understanding, FIG. 5 is a more detailed flow chart of a specific embodiment where the glue layer is applied on an etch chamber electrode. A hydrocarbon based glue layer is formed on an electrode in an etch chamber (step 520).

Figure 3:
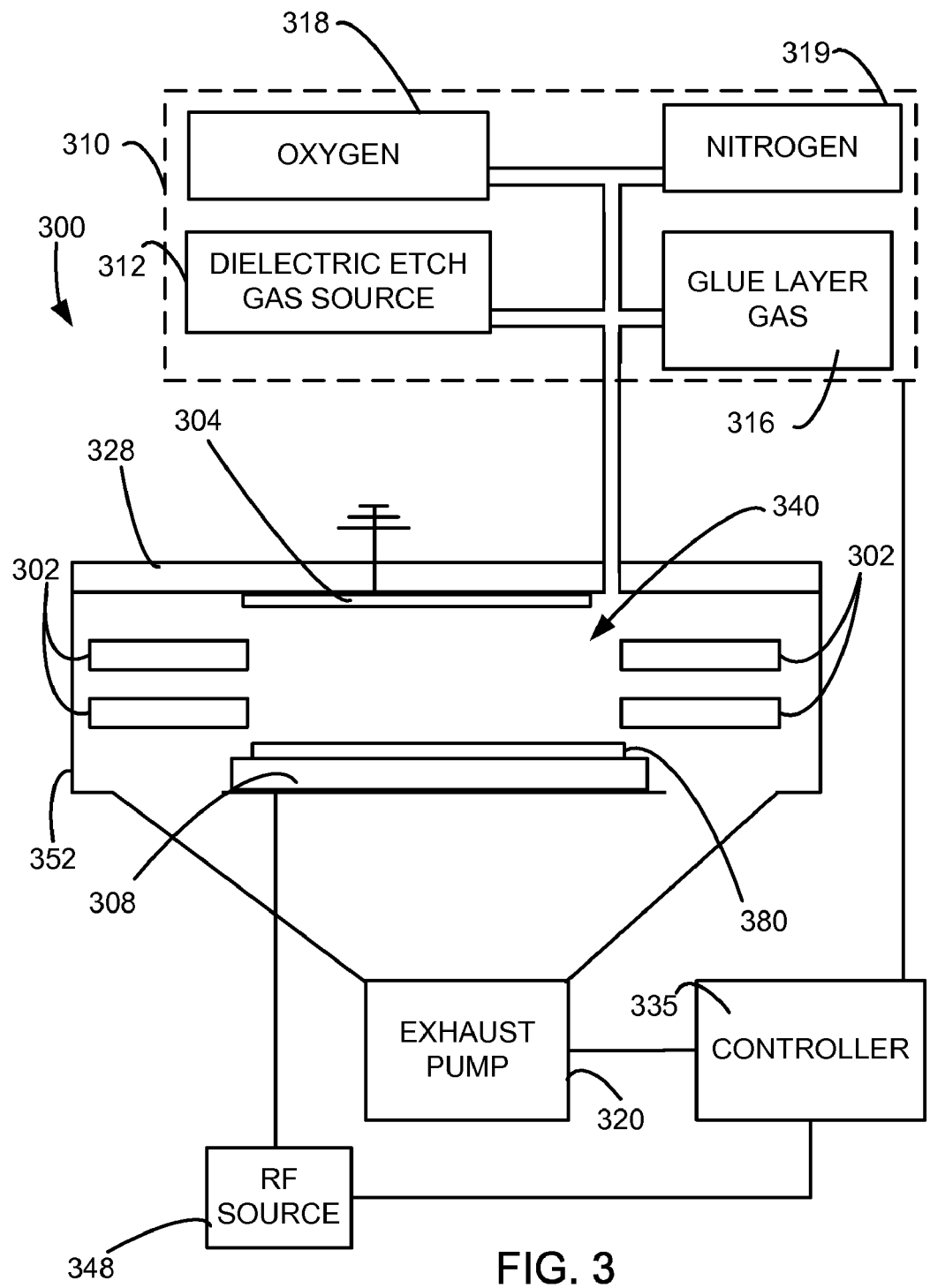
FIG. 3 is a schematic view of an etch chamber that may be used in a preferred embodiment of the invention.

FIG. 3 is a schematic view of an etch chamber 300 that may be used. The etch chamber 300 comprises confinement rings 302, a silicon containing upper electrode 304, a lower electrode 308, a gas source 310, and an exhaust pump 320. An example of a silicon containing upper electrode is a silicon or silicon carbide upper electrode. The gas source 310 comprises a dielectric etch gas source 312, a glue layer gas source 316, an oxygen gas source 318, and a nitrogen gas source 319. Various gases may be used for multiple processes. In such a case, the different gas sources may be combined. For example, nitrogen may be used during the dielectric etch. In such a case, only a single nitrogen source may be provided. The various gas sources are shown to schematically illustrate the workings of the invention. The gas source 310 may comprise additional gas sources. Within the etch chamber 300, the substrate 380 is positioned upon the lower electrode 308. The lower electrode 308 incorporates a suitable substrate chucking mechanism (e.g., electrostatic, mechanical clamping, or the like) for holding a substrate 380. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by the gas source 310 and is exhausted from the confined plasma volume through the confinement rings 302 and an exhaust port by the exhaust pump 320. An RF source 348 is electrically connected to the lower electrode 308. The upper electrode 304 is grounded. Chamber walls 352 surround the confinement rings 302, the upper electrode 304, and the lower electrode 308. The RF source 348 may comprise a 27 MHz power source and a 2 MHz power source. An Exelan DFC™ dielectric etcher, which is made by LAM Research Corporation™ of Fremont, Calif., was used in this example of the invention. Different combinations of connecting RF power to the electrode are possible in other embodiments, such as having an RF source connected to the upper electrode 304.

More generally, the dielectric etch chamber uses capacitive coupling, requiring a capacitor plate electrode spaced apart from a wafer, so that plasma is formed between the capacitor plate electrode and the wafer.

Figure 4A:
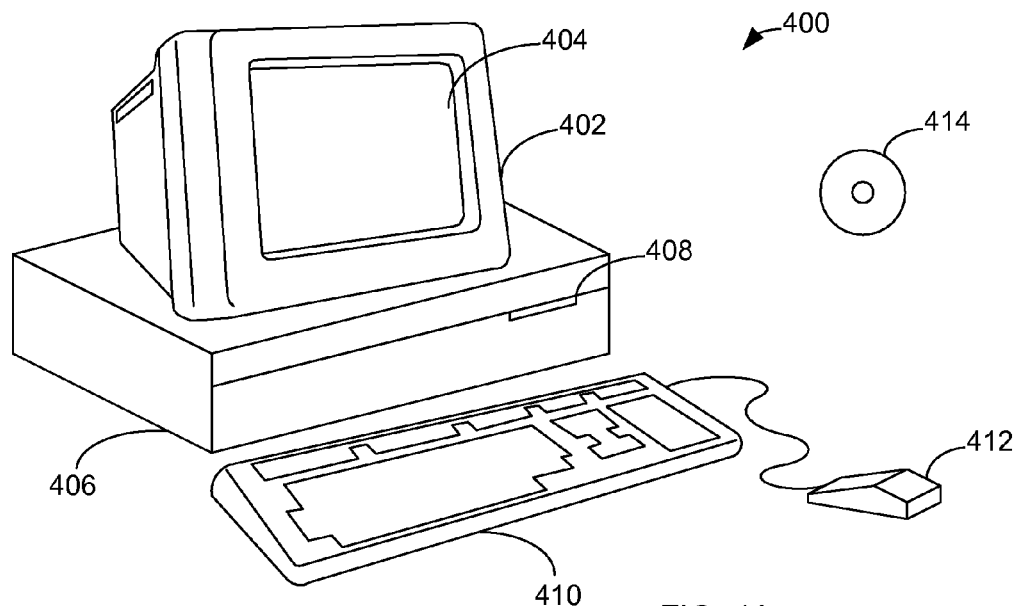
FIGS. 4A and 4B illustrate a computer system, which is suitable for implementing a controller.
Figure 4B:
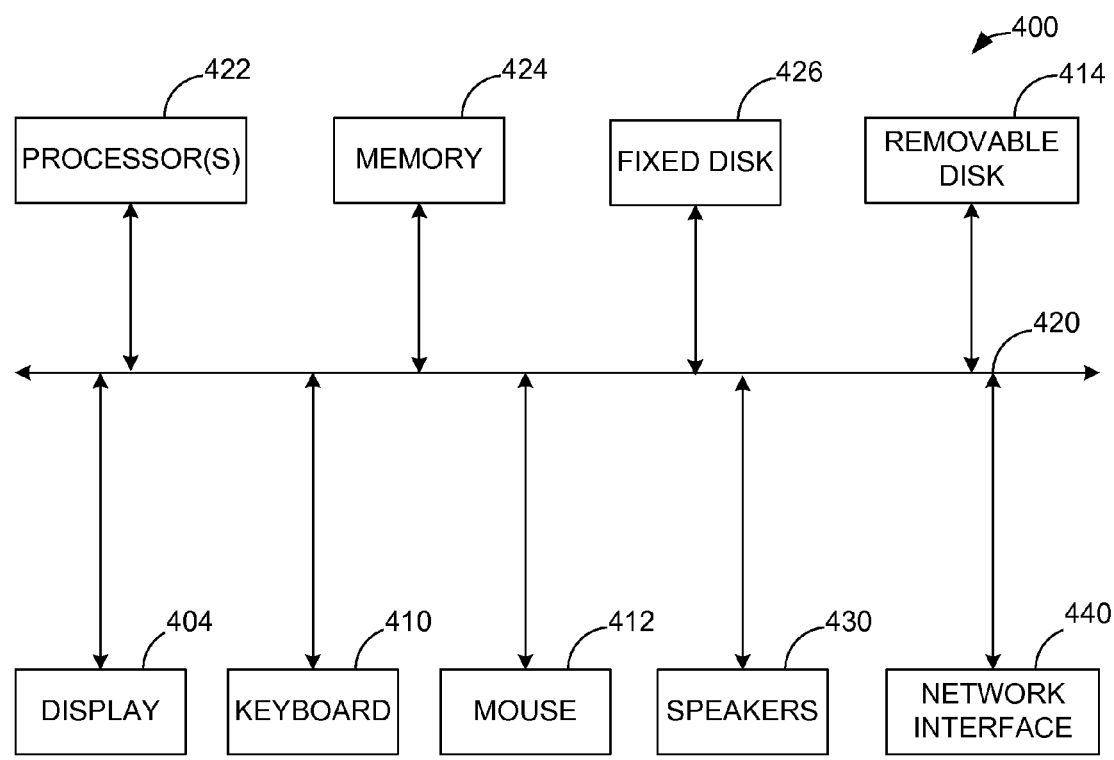

FIGS. 4A and 4B illustrate a computer system 400, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6A:
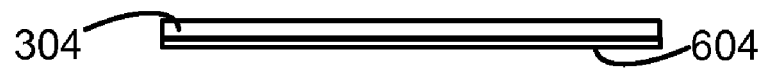
FIGS. 6A-C are schematic views of top and bottom electrodes during the process shown in FIG. 5.
Figure 6A:
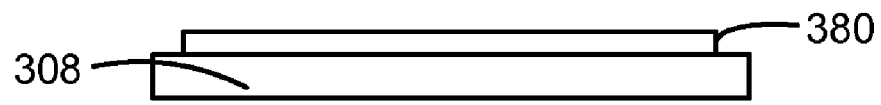

Preferably, the glue layer is a hydrocarbon polymer layer with a thickness of less than 1000 Å. More preferably, the glue layer has a thickness of less than 300 Å. Most preferably, the glue layer has a thickness no greater than 200 Å. FIG. 6A is a schematic illustration of the upper electrode 304 and lower electrode 308 after the glue layer 604 has been formed. The glue layer may be formed with a blank wafer 380 on the lower electrode 308. If a blank wafer 380 is used during the formation of the glue layer, the blank wafer 380 is subsequently removed.

A process wafer is then placed in the etch chamber (step 524). The process wafer has a dielectric layer disposed below a mask. The dielectric layer is etched (step 528). The etch process is a cyclical process with each cycle comprising a hydrofluorocarbon deposition phase and an etch phase, as shown in detail in FIG. 1. The hydrofluorocarbon deposition phase deposits a hydrofluorocarbon layer on the upper electrode 304. The etch dielectric layer phase etches features in the dielectric layer.

In one embodiment the, dielectric layer etch is a single cycle. An example of such a process may provide a thick hydrofluorocarbon layer to shrink the CD of the etched features and then provides an etch to etch features with a reduced CD. In such an example, the single hydrofluorocarbon layer deposition may be provided in a single step or with a plurality of cycles of a multiphase deposition process to form vertical sidewalls. In another embodiment, the dielectric layer etch comprises a plurality of cycles where each cycle comprises a hydrofluorocarbon deposition phase and a dielectric layer etch phase.

Since the etch dielectric layer step has a hydrofluorocarbon deposition phase, preferably the etch dielectric layer step causes a net formation of hydrofluorocarbon deposition on the upper electrode 304.

Figure 6B:
Figure 6B:
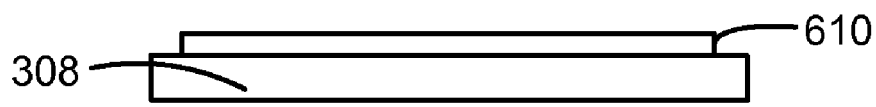

FIG. 6B is a schematic view of an upper electrode 304 and a lower electrode 308 and a process wafer 610 after the features are etched into the etch layer. A hydrofluorocarbon layer 608 has been deposited on the glue layer 604 on the upper electrode 304, as shown. The etch processes in these examples have a hydrofluorocarbon deposition phase and etch phase, which provide a net deposition of hydrofluorocarbon 608 on the upper electrode 304.

The wafer 610 is then removed from the chamber 300 (step 532). A determination is made on whether to process another wafer or to clean the chamber (step 536). If another wafer is to be processed, then a new wafer is placed in the chamber (step 524). Features are etched into the etch layer (step 528). The wafer is then removed (step 532). This cycle is continued until it is determined that either there are no more wafers or the chamber needs to be cleaned (step 536). In one embodiment, the cleaning may be performed after one wafer is processed. In another embodiment, the cleaning may be done after at least more than five wafers are processed.

If a specified number of wafers are processed between cleaning then another wafer is not provided, then a determination may be made as to whether to clean the chamber or to stop processing (step 540). If it is determined that the chamber is to be cleaned, a chamber cleaning is performed (step 544). The chamber cleaning is to remove the glue layer 604 and the hydrofluorocarbon layer 608 deposited on the upper electrode 304 and to remove hydrofluorocarbon deposited on other parts of the chamber 300. In one embodiment, the chamber clean is performed by placing a blank wafer into the chamber before the cleaning. In another embodiment, the chamber clean is performed without a wafer (waferless).

In an example of a cover wafer cleaning, a cleaning gas comprising oxygen is provided into the etch chamber 300. In this example, 200 sccm of $O_2$ is provided. The pressure in the etch chamber in this example is maintained at 400 mTorr. A cleaning plasma is formed from the cleaning gas mixture. In this example, 100 watts at 27 MHz and 100 watts at 2 MHz are provided by the RF source 348 for 45 seconds. The resulting plasma cleans the chamber.

Figure 6C:
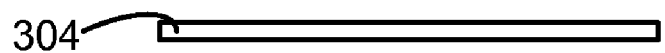
Figure 6C:
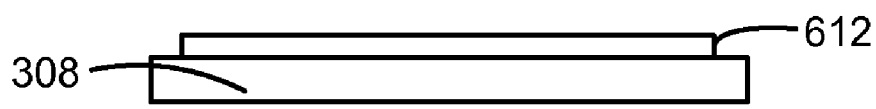

FIG. 6C shows the upper electrode 304 and lower electrode 308 and a blank wafer 612 after the cleaning. The cleaning has removed the hydrofluorocarbon layer and the glue layer. Preferably, the cleaning process uses an oxygen containing cleaning gas.

After the chamber clean (step 144), the glue layer is formed on the electrode (step 120). In this example, a roughening step is added. The roughening step roughens the surface of the electrode. An example of a recipe for the roughening step provides a roughening gas of 19 sccm $O_2$, 18 sccm $C_4F_8$, and 300 sccm Ar is provided to the etch chamber. The pressure in the chamber is maintained at 70 mTorr. The roughening gas is formed into a plasma. In this example, 200 watts at 27 MHz and 3000 watts at 2 MHz are provided by the RF source 348 for 15 seconds. In this example, the cleaning step and roughening step are followed by a hydrocarbon glue layer deposition step. A sample recipe provides a hydrocarbon glue layer gas of 200 sccm $C_2H_4$ at a pressure of 120 mTorr. The glue layer gas is formed into a plasma by providing 400 watts at 27 MHz for five seconds. After the glue layer is formed, the cover or blank wafer is removed.

Another wafer is placed in the chamber (step 524). Features are etched into an etch layer (step 528). The wafer is removed from the etch chamber (step 532).

It has been found that the glue layer helps to bind the deposited hydrofluorocarbon from the etch and deposition process to the upper electrode. Without the glue layer, it has been found that such hydrofluorocarbon may not be strongly bound to the electrode and may fall from the electrode and contaminate the wafer increasing the number of defective chips. Without being bound by theory, it is believed that a cleaning process with oxygen causes a thin layer of silicon oxide to be formed over the surface of the silicon containing electrode. The adhesion of the hydrofluorocarbon formed during the etch to the silicon oxide is low, which causes particles. The glue layer is able to more strongly bind the hydrofluorocarbon to the silicon oxide layer.

Preferably, the hydrocarbon glue layer is a polymer material. More preferably, the glue layer gas further comprises an inert gas, such as Ar. More preferably, the glue layer gas further comprises an oxygen containing gas.

In addition, in this example, where a blank wafer is provided during cleaning and formation of the glue layer, a higher power may be used to roughen the exposed surface of the silicon containing electrode. Such a high power might normally damage the lower electrode. However, the blank wafer protects the lower electrode. The roughening of the exposed electrode surface during the formation of the glue layer further increases adhesion between deposited hydrofluorocarbon and the electrode. To roughen the exposed surface of the upper electrode during the glue layer formation, preferably be greater than 1500 Watts at a frequency of at least 2 MHz and greater than 1000 Watts at a frequency of at least 27 MHz for a 300 mm wafer.

In an example of a waferless cleaning, a waferless automatic cleaning gas comprising oxygen is provided into the etch chamber 300. In this example, 2,000 sccm of $O_2$ is provided. The pressure in the etch chamber in this example is set to 600 mTorr. A waferless automatic cleaning plasma is formed from the waferless automatic cleaning gas mixture. In this example, 500 watts at 60 MHz, 500 watts at 27 MHz and 200 watts are 2 MHz are provided by the RF source 348 for 60 seconds. The resulting plasma cleans the chamber.

For this waferless automatic cleaning, a glue formation process provides 450 sccm $C_2H_4$. The chamber pressure is set to 100 mTorr. In this example, 200 watts at 27 MHz are provided by the RF source 348 for 5 seconds.

In a test of the invention, after a standard waferless automatic cleaning process with a total power of less than 800 watts forming a plasma from $O_2$, the particle level was found to be 1805 particles greater than 0.12 micron measured in a wafer. For a waferless automatic cleaning process with a total power greater than 800 watts and less than 2,000 watts, forming a plasma from an $N_2$ and $O_2$ gas mixture, the particle level was found to be 127. When the waferless automatic cleaning process with total power greater than 800 watts and less than 2,000 watts was performed and followed by a glue layer formation using $C_2H_4$ for 5 seconds the particle level was measured at 13. Therefore, the glue layer significantly reduced particle contamination.

In the above embodiment, the electrode that is cleaned and has the glue layer is the top electrode. This is because the wafer covers the bottom electrode, so that plasma is generated between the wafer and top electrode, but not between the wafer and bottom electrode. For this reason, the surface of the bottom electrode is not an exposed surface, whereas the surface of the top electrode is an exposed surface. In other etch chambers where the wafer is mounted over the top electrode so that the bottom electrode is exposed to the plasma, the cleaning cleans the bottom electrode and the glue layer is formed over the bottom electrode. Whether the wafer is mounted on the top, bottom or side of the chamber, depositing a hydrofluorocarbon over the etch layer would mean the same as if the wafer was on the bottom of the chamber. Similarly whether the bottom or top or a side electrode has the glue layer placed on the exposed surface of the electrode has the same meaning whether the electrode is the top, bottom, or on the side.

In other examples other parts of the chamber may be covered with a hydrocarbon based glue layer to reduce particles when those parts of the chamber are deposited with hydrofluorocarbon deposition.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching features in an etch layer disposed below a mask on a process wafer, comprising:
   depositing a hydrocarbon based glue layer; and
   etching the etch layer on the process wafer with at least one cycle, wherein each cycle comprises:
      depositing a hydrofluorocarbon layer over the mask and on the hydrocarbon based glue layer, wherein the hydrocarbon based glue layer increases adhesion of the hydrofluorocarbon layer; and
      etching the etch layer.

2. The method, as recited in claim 1, wherein the etching the etch layer comprises at least three cycles.

3. The method, as recited in claim 2, wherein the hydrocarbon based glue layer is less than 1000 Å thick.

4. The method as recited in claim 3, further comprising:
   cleaning an etch chamber, which cleans an electrode in the etch chamber, wherein the depositing the hydrocarbon based glue layer deposits the hydrocarbon based glue layer on the electrode after the cleaning the etch chamber; and
   placing the process wafer in the etch chamber.

5. The method, as recited in claim 4, wherein the electrode is a silicon containing electrode.

6. The method, as recited in claim 5, wherein the etch layer is of a dielectric material.

7. The method, as recited in claim 6, wherein depositing the hydrocarbon based glue layer roughens a surface of the electrode.

8. The method, as recited in claim 7, further comprising providing a blank wafer into the etch chamber, wherein during the cleaning of the etch chamber and depositing the hydrocarbon based glue layer the blank wafer is in the etch chamber.

9. The method, as recited in claim 6, wherein the depositing the hydrocarbon based glue layer provides a power of at least 1500 watts of at least 2 MHz and at least 1000 watts of at least 27 MHz to roughen a surface of the electrode.

10. The method, as recited in claim 9, wherein cleaning the etch chamber is an oxygen cleaning, which forms a siliconoxide layer over the electrode.

11. The method, as recited in claim 1, wherein the depositing the hydrocarbon based glue layer comprises:
   providing a fluorine free hydrocarbon gas; and
   forming a plasma from the fluorine free hydrocarbon gas.

12. The method, as recited in claim 1, wherein the mask has mask features, wherein the hydrocarbon based glue layer forms over the mask and forms sidewalls on the mask features, wherein the sidewalls have a glue layer thickness of less than 10 Å.

13. The method, as recited in claim 12, wherein the depositing the hydrofluorocarbon layer forms sidewalls over the hydrocarbon based glue layer on the mask features with a thickness greater than 20 Å.

14. The method, as recited in claim 1, wherein the depositing the hydrofluorocarbon layer, comprises:
   providing a hydrofluorocarbon gas; and
   forming a plasma from the hydrofluorocarbon gas.

15. The method, as recited in claim 1, further comprising:
   placing the etch layer disposed below the mask into an etch chamber, wherein the depositing the hydrocarbon based glue layer, comprises:
      providing a hydrocarbon gas into the etch chamber; and
      forming a plasma from the hydrocarbon gas in the etch chamber.

16. The method, as recited in claim 15, wherein the etching the etch layer comprises:
   providing an etch gas into the etch chamber; and
   providing power to transform the etch gas into a plasma in the etch chamber, and wherein the depositing the hydrofluorocarbon layer over the mask and on the hydrocarbon based glue layer comprises:
      providing a hydrofluorocarbon deposition gas into the etch chamber; and
      providing power to transform the hydrofluorocarbon etch gas into a plasma in the etch chamber.

17. The method, as recited in claim 16, wherein the etching the etch layer comprises at least three cycles.

18. The method, as recited in claim 17, wherein the hydrocarbon based glue layer is less than 1000 Å thick.

* * * * *